United States Patent
Park et al.

(10) Patent No.: US 9,532,452 B2
(45) Date of Patent: Dec. 27, 2016

(54) PRINTED CIRCUIT BOARD

(71) Applicant: LG INNOTEK CO., LTD., Seoul (KR)

(72) Inventors: Jeong Won Park, Seoul (KR); Hee Beom An, Seoul (KR); Kyu Dong Kang, Seoul (KR); Gyu Ho Park, Seoul (KR); Su Jin Park, Seoul (KR); Sang Hoon Yoon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/607,199

(22) Filed: Jan. 28, 2015

(65) Prior Publication Data

US 2015/0216052 A1    Jul. 30, 2015

(30) Foreign Application Priority Data

Jan. 28, 2014 (KR) .......... 10-2014-0010328

(51) Int. Cl.
*H05K 1/11* (2006.01)
*H05K 1/03* (2006.01)

(52) U.S. Cl.
CPC ............. *H05K 1/115* (2013.01); *H05K 1/0366* (2013.01); *H05K 2201/09863* (2013.01)

(58) Field of Classification Search
CPC ...................................... H05K 1/115
USPC .......................................... 174/262
See application file for complete search history.

(56) References Cited

U.S. PATENT DOCUMENTS

| | | | |
|---|---|---|---|
| 6,720,661 B2* | 4/2004 | Hanaoka ......... | H01L 21/76898 257/621 |
| 8,665,580 B2* | 3/2014 | Choi ............... | H01G 4/10 361/322 |
| 2007/0018339 A1* | 1/2007 | Takinomi ......... | H01L 24/06 257/786 |
| 2014/0069705 A1* | 3/2014 | Lee ................. | H05K 3/4682 174/262 |
| 2014/0246227 A1* | 9/2014 | Lin ................. | H01L 23/5389 174/266 |

* cited by examiner

*Primary Examiner* — Hoa C Nguyen
*Assistant Examiner* — Stanley Tso
(74) *Attorney, Agent, or Firm* — KED & Associates LLP

(57) ABSTRACT

A printed circuit board includes a substrate; and a hole passing through first and second surfaces of the substrate. The hole includes an area in which a width of the hole formed in an inner side of the substrate is formed larger than that of an opening formed on the first surface and/or the second surface.

8 Claims, 2 Drawing Sheets

PRINTED CIRCUIT BOARD

CROSS-REFERENCE TO RELATED APPLICATION

This application claims priority under 35 U.S.C. §119 to Korean Application No. 10-2014-0010328, filed on Jan. 28, 2014, in the Korean Intellectual Property Office, whose entire disclosure is hereby incorporated by reference.

BACKGROUND

1. Field

Embodiments of the present disclosure relate to a printed circuit board.

2. Background

A printed circuit board (PCB) results from printing a circuit on an electrical insulation substrate using a conductive material, and various elements are mounted on the electrical insulation substrate, and the circuit is composed of a conductive printed circuit. The printed circuit board is configured such that a mounting position for each element is fixed in order for many elements to be closely mounted on a flat plate, and the elements are fixed by printing circuit lines connecting the elements on a surface of the flat plate.

According to recent miniaturization of a portable terminal, the improvement of miniaturization and the degree of integration of a printed circuit substrate used in the portable terminal has been required, and accordingly, a technology in which elements are arranged on both surfaces of the printed circuit board by forming a hole passing through an electrical insulation substrate has been widely used.

Since the both surfaces of the electrical insulation substrate are subjected to a drill process, it is problematic in that eccentricity is generated upon performing the drill process for the respective surfaces, or a hole fails to pass through the insulating substrate when the drill process for any one surface of the both surfaces is not deeply performed.

BRIEF DESCRIPTION OF THE DRAWINGS

The embodiments will be described in detail with reference to the following drawings in which like reference numerals refer to like elements wherein.

DETAILED DESCRIPTION

Figure 1:
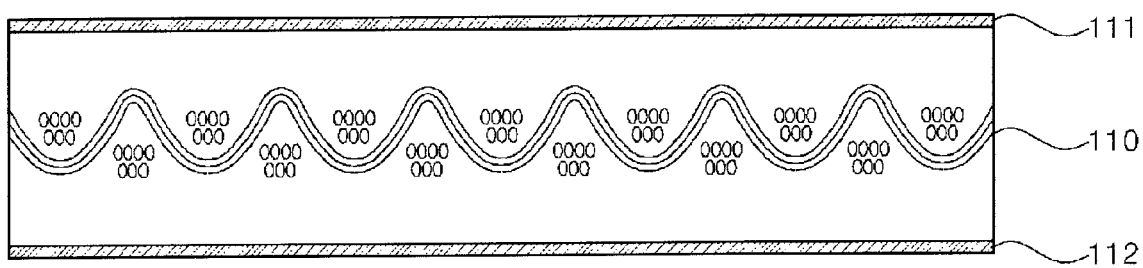
FIGS. 1 and 2 are views illustrated for explaining a printed circuit board according to an embodiment of the present disclosure and a method of manufacturing the printed circuit board.

As illustrated in FIG. 1, the printed circuit board according to the embodiment of the present disclosure is configured such that a conductive layer 111 is formed on one surface of a substrate 110, and a conductive layer 112 is formed on the other surface of the substrate 110. The substrate 110 may be made of an insulating material and may contain, for example, a glass fiber and a resin material. The conductive layers 111, 112 may be made of a conductive material, and Cu as a metal material may be used as the conductive material. The conductive layers 111, 112 may be also formed with conductive terminals via processing.

The printed circuit board formed as described above may have a hole 115 as illustrated in FIG. 2. The hole 115 may be a via subjected to metal plating in the entire inside thereof or a through hole subjected to metal plating only on an internal surface thereof. The hole 115 is formed to pass through the substrate 110, and a width L1 of the hole formed in an inner side of the substrate 110 is formed lager than a width L2 of the hole formed on one surface or the other surface of the substrate 110. The hole 115 may be formed via laser processing. At this time, a YAG laser may be used upon the laser processing. The hole 115 may be formed by performing laser processing once using the laser.

A structure of the printed circuit board according to the embodiment of the present disclosure will be described with reference to FIGS. 2 to 4.

Figure 2:
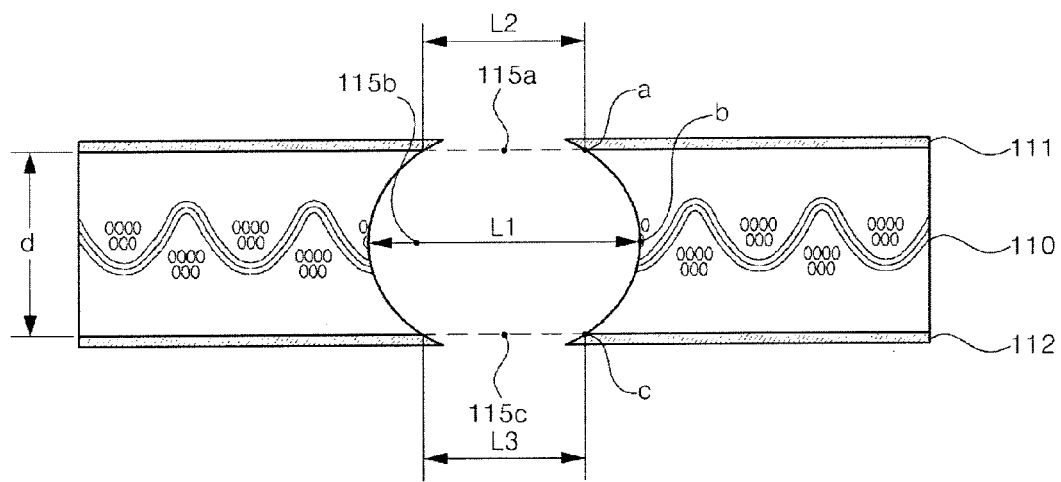

With reference to FIG. 2, the printed circuit board according to the embodiment of the disclosure includes: the substrate 110; the hole 115 passing through one surface of the substrate 110 and the other surface facing the one surface. In such a case, in the one surface of the substrate, the hole 115 may include a region in which a width of the hole formed in an inner side of the substrate is formed larger than a width of an opening of the other surface.

The hole 115 may be implemented to have a region with a larger width than that of each opening of both ends. The hole 115 according to the present embodiment of the disclosure includes: a first opening 115a provided on the one surface of the substrate; a through part 115b extending from the first opening 115b and passing through the inner side of the substrate; and an second opening 115c connected to the through part 115b provided on the other surface of the substrate, wherein a maximum width L1 of the through part 115b is implemented larger than each of a width L2 of the first opening 115a and a width L3 of the second opening 115c. The maximum width L1 of the through part 115b is defined as the longest width among various widths resulting from a drawing horizontal segment from an arbitrary point on one side inside the through part to an arbitrary point on the other side.

Referring to FIG. 2, in the structure of the hole 115, a shape of the through part 115b may be implemented in a structure in which an internal surface of the through part intended for connecting one end (a) of the first opening 115a and one end (b) of the second opening 115c has a curvature. As an example of such a structure having a curvature, the hole 115 may be configured such that an imaginary extension line extending along the curvature formed by an internal surface of the through part forms a circular or elliptical shape. In another embodiment, the imaginary extension line extending along the curvature formed by the internal surface of the through part may be formed in various forms, such as a jar-like shape which is configured such that a width L1 of a point having a maximum width of the through part of the hole is formed larger than each width L2, L3 of the first opening 115a and the second opening 115c of the substrate 110.

In the present embodiment of the disclosure, the hole may be configured such that a width between an arbitrary point (b) having a maximum width of the through part 115a and one end (a) of the first opening, or a width between the arbitrary point (b) having the maximum width of the through part 115b and one end (c) of the second opening increases gradually. The hole of this structure may be implemented to have a curvature as the shapes of the through part 115b of FIGS. 2 and 4, or may be implemented in a straight line type structure having no curvature (hereinafter referred to as 'the structure having no curvature') as the through part 115b of FIG. 3. In particular, the structure of FIG. 3

Figure 3:
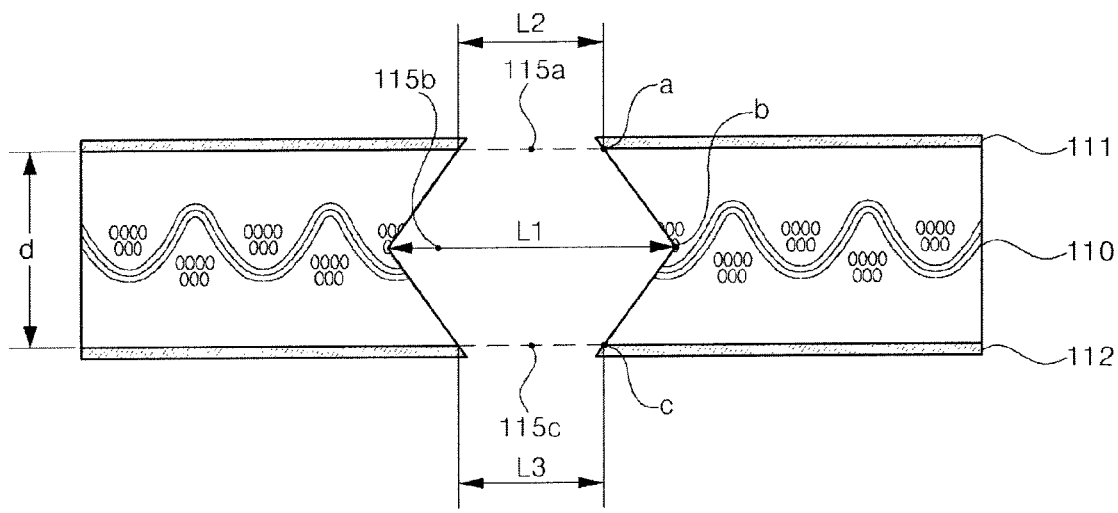
FIGS. 3 and 4 are cross-sectional views of a printed circuit board according to another embodiment of the present disclosure.

The hole having the structure of FIG. 3 may be implemented in a linear structure in which an internal surface of the through part intended for connecting an arbitrary point (b) having a maximum width of the through part 115b and one end (a) of the first opening, or an internal surface of the through part for connecting the arbitrary point (b) having the maximum width of the through part 115b and one end (c) of the second opening has a predetermined slope. In such a case, a line for connecting an arbitrary point (b) having a maximum width of the through part 115b and one end (a) of the first opening, or a line for connecting the arbitrary point (b) having the maximum width of the through part 115b and one end (c) of the second opening has a predetermined slope may be implemented to form an angle of less than 180°. Preferably, the angle may be implemented in the range of 30 to 175°. In particular, the angle may be variously implemented in the range of 45 to 150° and 60 to 120°. When the angle is more than 175°, it is difficult to implement the effect of a reduction in a defect resulting from the occurrence of eccentricity, and when the angle is less than 30°, it is difficult to process the hole.

The hole 115 may be also configured such that the width L1 formed in the inner side of the substrate 110 is formed larger than a thickness d of the substrate 110. For example, when the hole 115 is formed in the substrate 110 to have a circular cross-section, the width L1 of the through part 115b formed in the inner side of the substrate 110 may be formed larger than the thickness d of the substrate.

When the hole 115 is configured such that the width L1 of the through part 115b formed in the inner side of the substrate 110 is formed larger than the thickness d of the substrate 110, the hole 115 may be formed to pass through the substrate 110 even in a case where eccentricity of the hole 115 is partially generated.

At this time, the hole 115 is configured such that the maximum width L1 of the through part formed in the inner side of the substrate 110 is formed to be increased up to 5 to 15% compared to the thickness d of the substrate 110, thereby preventing the occurrence of a defect that the hole 115 fails to pass through the substrate 110. In a case where the hole is configured such that the maximum width L1 of the through part formed in the inner side of the substrate is formed to be increased up to less than 5% compared to the thickness d of the substrate 110, the defect that the hole 115 fails to pass through the substrate 110 may be generated when eccentricity of the hole 115 occurs.

When the hole is configured such that the maximum width L1 of the through part formed in the inner side of the substrate is formed to be increased up to more than 15% compared to the thickness d of the substrate 110, an area of the hole 115 in the substrate 110 is excessively largely formed. Thus, the problem of a reduction in durability of the substrate 110 may be generated, or a problem of the separation of metal plating may be generated when metal plating is performed.

As illustrated in FIG. 3, the printed circuit board according to another embodiment of the present disclosure is configured such that the conductive layer 111 is formed on one surface of the substrate 110, and the conductive layer 112 is formed on the other surface of the substrate 110. The substrate 110 may be made of an insulating material and may be configured to contain, for example, a glass fiber and a resin material.

The conductive layers 111, 112 may be made of a conductive material. Copper Cu may be used as the conductive material which is a metal material. The conductive layers 111, 112 may be formed as conductive terminals via processing.

The hole 115 is formed to pass through the substrate 110. The hole 115 may be formed via laser processing. The laser processing may be performed in such a manner that the hole 115 is by performing laser processing once using a Yag laser.

The hole 115 may be configured such that the maximum width L1 of the through part 115b formed in the inner side of the substrate 110 is formed larger than each width L2, L3 of the first opening 115a and the second opening 115c formed on one surface and the other surface of the substrate 110, respectively.

In the embodiments of FIGS. 1 to 4, the printed circuit board in which various holes having various structures of the through part are arranged in such a manner that at least two holes are combined. Unlike in the embodiment of FIG. 2, in the embodiment of FIG. 4, the hole 115 may be configured such that a width L2 of the first opening 115a formed on one surface of the substrate 110 is formed smaller than a width L3 of the second opening 115c formed on the other surface of the substrate 110.

Figure 4:
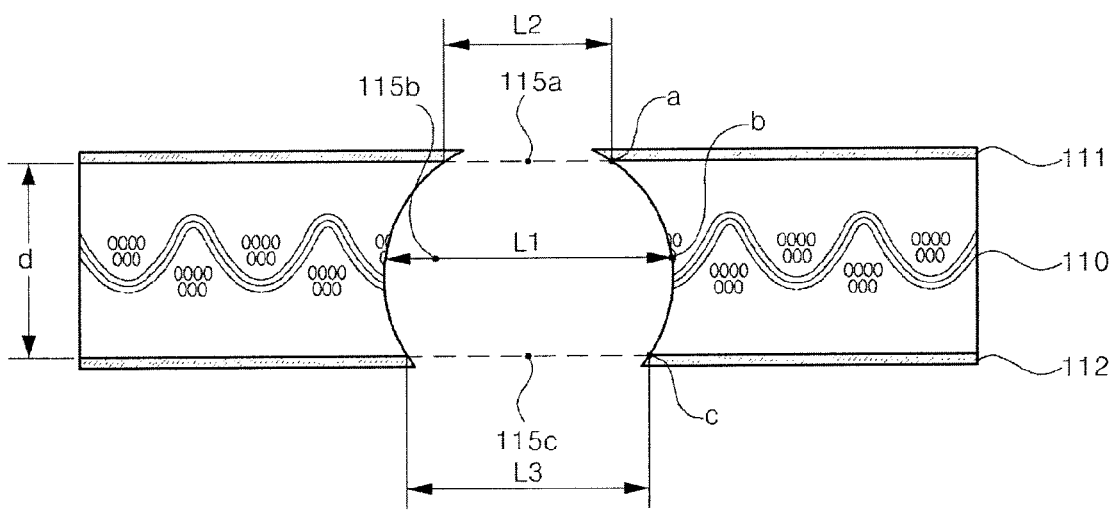

In the embodiment of FIG. 4, which is an embodiment in which eccentricity is generated upon forming the hole 115, the hole 115 is configured such that the width L2 of the first opening 115a formed on one surface of the substrate 110 is formed to be different from the width L3 of the second opening 115c formed on the other surface.

In the embodiment of FIG. 4, a width L1 in a diameter of the hole 115 is formed larger than a thickness of the substrate 110, and the hole is configured such that the width L1 formed in the inner side of the substrate 110 is formed larger than the width L2 or L3 formed on one surface or the other surface of the substrate 110.

According to the present embodiment of the disclosure, as illustrated in FIG. 4, since the width L1 in a diameter of the hole 115 is formed larger than the thickness of the substrate 110, a defect that the hole 115 fails to pass through the substrate 110 is not generated even when eccentricity is partially generated upon forming the hole 115.

As set forth above, according to some embodiments of the present disclosure, a hole is configured such that a width formed in an inner side of the substrate is formed larger than a width formed on one surface or the other surface of the substrate so that the hole can be formed to pass through the substrate even when eccentricity of the hole is partially generated.

Also, according to some embodiments of the present disclosure, the hole passing through the substrate is formed by performing laser processing once so that a process can be simplified compared to that of the conventional art, and a production cost can be reduced.

An aspect of the present disclosure provides a printed circuit board including a hole that passes through a substrate and is configured such that a width of the hole formed in an inner side of the substrate is formed larger than a width of the hole formed on one surface or the other surface of the substrate, namely, a hole capable of passing through the substrate even when eccentricity of the hole is partially generated.

Another aspect of the present disclosure also provides a printed circuit board which is configured such that a hole passing through a substrate is formed by performing processing once so that a process can be simplified compared to a conventional art, and a production cost can be reduced.

According to an aspect of the present disclosure, there is provided a printed circuit board, including: a substrate; and a hole passing through one surface of the substrate and the other surface facing the one surface, wherein the hole includes an area in which a width of the hole formed in an inner side of the substrate is larger than that of an opening of the one surface or the other surface.

In particular, the hole may include a first opening provided on the one surface; a through part extending from the first opening and passing through the inner side of the substrate; and a second opening connected to the through part and provided on the other surface, wherein a maximum width of the through part is formed larger than each width of the first opening and the second opening.

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A printed circuit board, comprising:
    a substrate;
    a first conductive layer on a top surface of the substrate;
    a second conductive layer on a bottom surface of the substrate;
    and a hole passing through a top surface of the first conductive layer and a bottom surface of the second conductive layer,
    wherein the hole includes
        a first opening part passing through the first conductive layer;
        a second opening part passing through the second conductive layer;
        and a through part disposed between the first opening part and the second opening part,
        and the through part passing through the substrate,
    wherein a width between an arbitrary point having a maximum width of the through part and the first opening part or the second opening part decreases gradually from the arbitrary point to the first opening part or to the second opening part,
    wherein a width of the first opening part gradually decreases from the bottom surface of the first conductive layer to the top surface of the first conductive layer,
    wherein a width of the second opening part gradually decreases from a top surface of the second conductive layer to a bottom surface of the second conductive layer,
    wherein an internal surface of the first opening part has a curvature extending along an internal surface of the through part,
    and wherein an internal surface of the second opening part has a curvature extending along an internal surface of the through part,
    wherein the maximum width of the through part is larger than each width of the first opening part and the second opening part,
    wherein the internal surface of the through part has a curvature,
    wherein an imaginary extension line extending along the curvature formed by the internal surface of the through part forms a circular or elliptical shape,
    wherein the maximum width of the through part is larger than a thickness of the substrate and is formed to be increased up to 5 to 15% compared to the thickness of the substrate.

2. The printed circuit board of claim 1, wherein the internal surface of the through part intended for connecting the arbitrary point having the maximum width of the through part and the first opening part or the second opening part has a linear structure with a predetermined slope.

3. The printed circuit board of claim 1, wherein the width of the first opening part or the second opening part is smaller than a thickness of the substrate.

4. The printed circuit board of claim 1, wherein the substrate is an insulating member.

5. The printed circuit board of claim 4, wherein the substrate contains a glass fiber and a resin material.

6. The printed circuit board of claim 1, wherein the hole is configured such that a plurality holes are formed on the substrate, the first conductive layer and the second conductive layer, and an inner side of the through part of at least one hole among the plurality of holes is coated with a conductive material.

7. The printed circuit board of claim 6, wherein the conductive material and the first and second conductive layers are connected to each other.

8. The printed circuit board of claim 1, wherein at least two holes having a curved structure in which the internal surface of the through part has a curvature, or a non-curved structure are combined.

* * * * *